United States Patent [19]

Nesbitt

[11] Patent Number: 4,746,861
[45] Date of Patent: May 24, 1988

[54] TEST FIXTURE FOR PRINTED CIRCUIT BOARD ASSEMBLY

[75] Inventor: Robert J. Nesbitt, North Attleboro, Mass.

[73] Assignee: TTI Testron, Inc., Cumberland, R.I.

[21] Appl. No.: 899,736

[22] Filed: Aug. 21, 1986

[51] Int. Cl.$^4$ ............................................. G01R 31/02
[52] U.S. Cl. .............................. 324/158 F; 324/158 P; 324/73 PC
[58] Field of Search ........... 324/158 P, 158 F, 73 PC; 339/117 P; 439/42

[56] References Cited

U.S. PATENT DOCUMENTS

| | | | |
|---|---|---|---|
| 3,970,934 | 7/1976 | Aksu | 324/158 P X |
| 4,322,682 | 3/1982 | Schadwill | 324/158 F X |
| 4,626,776 | 12/1986 | Wilkinson | 324/158 F X |
| 4,643,501 | 2/1987 | Coffin | 339/117 P |

Primary Examiner—Reinhard J. Eisenzopf
Assistant Examiner—Vinh P. Nguyen
Attorney, Agent, or Firm—Salter & Michaelson

[57] ABSTRACT

A test fixture for testing a printed circuit board assembly on a computerized test system includes a vacuum-actuated base which is receivable and securable in electrically connected relation on the test system and a vacuum-actuated test head which is releasably receivable on the base and adapted for receiving a printed circuit board assembly thereon to electrically interconnect the printed circuit board assembly to the test system through the base. The test head is readily interchangeable with other test heads to enable the fixture to be adapted for testing printed circuit board assemblies of different configurations on the test system without disconnecting the base from the test system.

11 Claims, 6 Drawing Sheets

TEST FIXTURE FOR PRINTED CIRCUIT BOARD ASSEMBLY

BACKGROUND AND SUMMARY OF THE INVENTION

The instant invention relates to electronic test equipment and more particulary to a test fixture for use in combination with a computerized test system for testing printed circuit board assemblies.

Computerized test systems have generally been found to be highly effective for use in testing printed circuit board assemblies of various types. In this regard, it has been found that for both economic and practical reasons, computerized test systems generally provide the most effective means for testing printed circuit board assemblies, particularly when testing large quantities of identical printed circuit board assemblies, such as those manufactured in mass production operations. Most of the heretofore available computerized test systems have comprised test computers having software which enables them to be used for testing various portions of printed circuit board assemblies as well as various specific electronic components which are assembled in the printed circuit board assemblies. However, in order to electrically interconnect computerized test systems to printed circuit board assemblies, it has generally been necessary to use test fixtures which are adapted to receive specific printed circuit boards of predetermined configurations thereon and which are adapted to be received on specific test systems.

One specific type of computerized test system which has been heretofore available and widely used for testing printed circuit board assemblies is the Teradyne L200 test system manufactured by Teradyne, Inc. of Boston, Mass. It has been found that the L200 test system can be effectively utilized for testing various different types of printed circuit board assemblies, but that it requires the use of a different test fixture for interconnecting it with each different type of printed circuit board assembly. In this regard, the Teradyne L200 test system is operable in combination with a test fixture of a type which includes a plurality of substantially parallel "paddle cards" on the underside thereof, and hence it includes a plurality of zero insertion force edge cards connectors which are adapted to receive the paddle cards of a test fixture for securing the test fixture to the L200 test system. The paddle cards which are normally utilized in a fixture of this type comprise individual printed circuit boards having gold-edge fingers along the bottom edges thereof which are receivable in the edge card connectors of a test system for electrically connecting the paddle cards to the test system. A conventional test fixture of this type generally further comprises a flexible diaphragm having an open frame therein which is adapted to receive a printed circuit board assembly of specific configuration therein and means for electrically interconnecting the printed circuit board assembly to specific paddle cards of the fixture. In this connection, the diaphragm of a test fixture of this type is generally deformable for drawing a printed circuit board assembly on the fixture downwardly to electrically connect it to the printed circuit board assembly, and vacuum means is generally provided in the test system for drawing the diaphragm downwardly to electrically connect the printed circuit board assembly to the fixture. Accordingly, after a fixture of this type has been assembled on a test system, such as a Teradyne L200 test system, it is possible to test a plurality of printed circuit board assemblies of a specific type in rapid succession by individually placing the printed circuit board assemblies in the frame of the diaphragm, applying vacuum to the diaphragm to draw it downwardly so that the printed circuit board assembly is electrically connected to the fixture, and then electronically testing the printed circuit board assembly. However, since each fixture is adapted for use in combination with a specific type of printed circuit board assembly, it is necessary to utilize a different fixture each time a different type of printed circuit board assembly is tested on the test system. Further, it has been found that the procedures which are required for changing fixtures of this type can often be tedious and time consuming and that fixtures can be rather cumbersome, while nevertheless being relatively delicate and fragile.

The instant invention provides an improved test fixture which overcomes many of the disadvantages of the heretofore available test fixtures, particularly those of the above described type which have been used in combination with the Teradyne L200 test system. More specifically, the test fixture of the instant invention comprises a base which is adapted to be received on a test system and a removable test head which is adapted to receive a specific type of printed circuit board assembly thereon but which is removably receivable on the base. The base comprises a first diaphragm having a first open receiving frame therein for receiving the test head on the base, and the base is responsive to the vacuum means of a test system for deforming the first diaphragm in order to electrically interconnect the test head to the test system. The test head comprises a second diaphragm having a second open receiving frame therein for receiving a printed circuit board assembly on the fixture, the second diaphragm communicating with the vacuum means and being responsive thereto for deforming the second diaphragm for electrically connecting the printed circuit board assembly to the test head. The test fixture of the subject invention is preferably adapted for use in combination with a test system, such as the Teradyne L200 test system, and hence the base portion of the fixture preferably comprises a plurality of paddle cards which are adapted to be received in electrically connected relation on a test system. The base preferably further comprises a plurality of spring probes which are mounted on a fixed probe plate and electrically connected to the paddle cards, the spring probes being engageable with the test head portion of the fixture for electrically interconnecting the test head to the test system when vacuum is applied to the diaphragm of the base portion to move it toward the probe plate. A rubberized seal is preferably provided in the open frame in the diaphragm of the base, and a plurality of stop discs are preferably provided in the seal for preventing it from being overcompressed. The test head preferably comprises a plurality of spring probes and a fixed probe plate, and the spring probes on the test head are preferably positioned so that they are engageable with a printed circuit board assembly to electrically connect the printed circuit board assembly to the test head when vacuum is applied to the diaphragm of the test head. The test head preferably further comprises a plurality of contact heads which are electrically connected to the spring probes, and positioned so that they are engageable with the base to electrically connect the test head to the base when vacuum is applied to the base.

For use and operation of the test fixture of the instant invention, the base is assembled on a test system, and it is secured to the test system so that it is electrically connected thereto and so that the diaphragm of the base is in communication with the vacuum means of the test system. Thereafter, a test head is assembled on the base so that the diaphragm of the test head is in communication with the vacuum means of the test system, and a printed circuit board assembly is assembled in the open frame on the diaphragm of the test head. Thereafter, the vacuum means of the test system is actuated to electrically connect the test head to the base, and it is also actuated to electrically connect the printed circuit board assembly to the test head so that the test system can carry out the necessary electrical tests on the printed circuit board assembly. As soon as the necessary tests have been completed, the vacuum means is deactuated with respect to the test head, so that the printed circuit board assembly thereon can be replaced with another printed circuit board assembly of similar configuration. In order to test a printed circuit board assembly of a different configuration on the test system, the vacuum means is also deactuated with respect to the base, the test head is removed from the base, and a new test head which is adapted to receive the new printed circuit board assembly thereon is assembled on the base. Thereafter, the new printed circuit board assembly is positioned in the open frame of the new test head, and the vacuum means of the test system is actuated to electrically interconnect the new printed circuit board assembly to the test system so that the necessary electrical tests can be carried out. Accordingly, because the test fixture of the instant invention is a two-piece fixture which includes a base and a test head, it is only necessary to change the test head rather than the entire test fixture in order to test a different type of printed circuit board assembly on the test system. In this regard, since the test head is adapted to be quickly and easily electrically connected to the test system by applying vacuum to the base, different test heads can be quickly and easily interchanged on the base. On the other hand, the base, which requires substantially more complicated manipulations to electrically connect it to the test system, does not need to be changed each time a new type of printed circuit board assembly is tested on the test system.

Accordingly, it is an object of the instant invention to provide a test fixture for testing a printed circuit board assembly on a computerized test system wherein the test fixture includes an interchangeable test head to enable the test fixture to be adapted to accommodate different types of printed circuit board assemblies.

Another object of the instant invention is to provide a test fixture for testing a printed circuit board assembly on a computerized test system, wherein the test fixture includes a base and a test head which is removable from the base.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
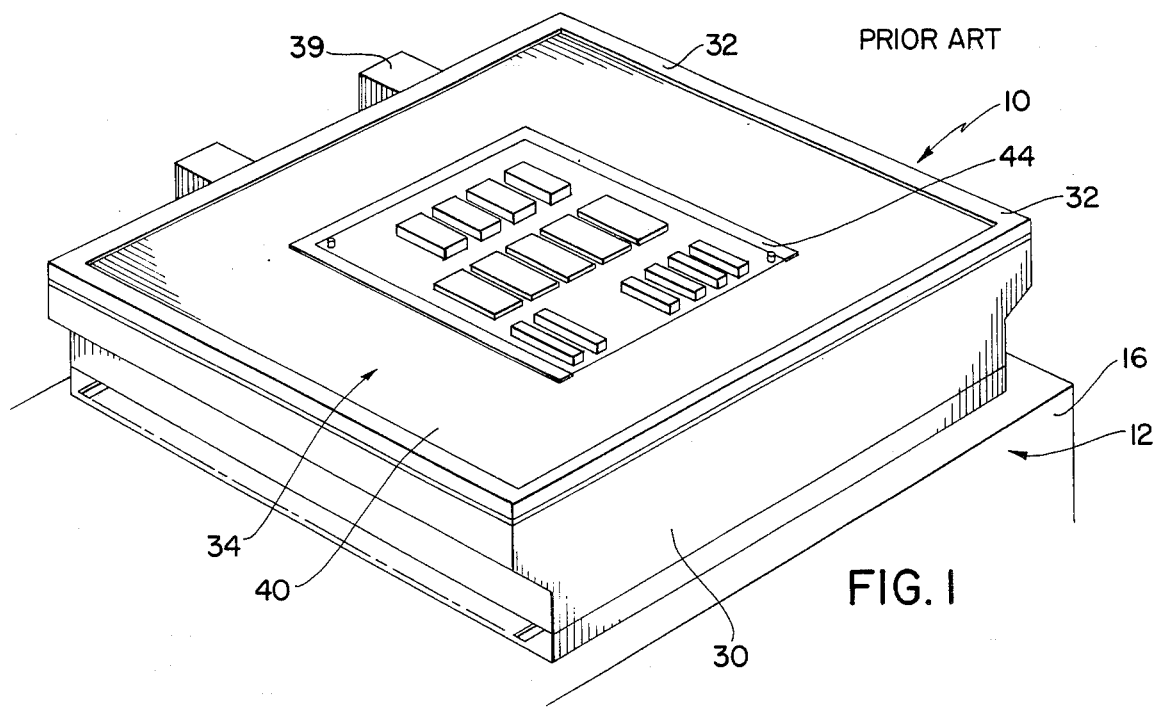
FIG. 1 is a perspective view of a test fixture of the prior art assembled on a test system.
Figure 2:
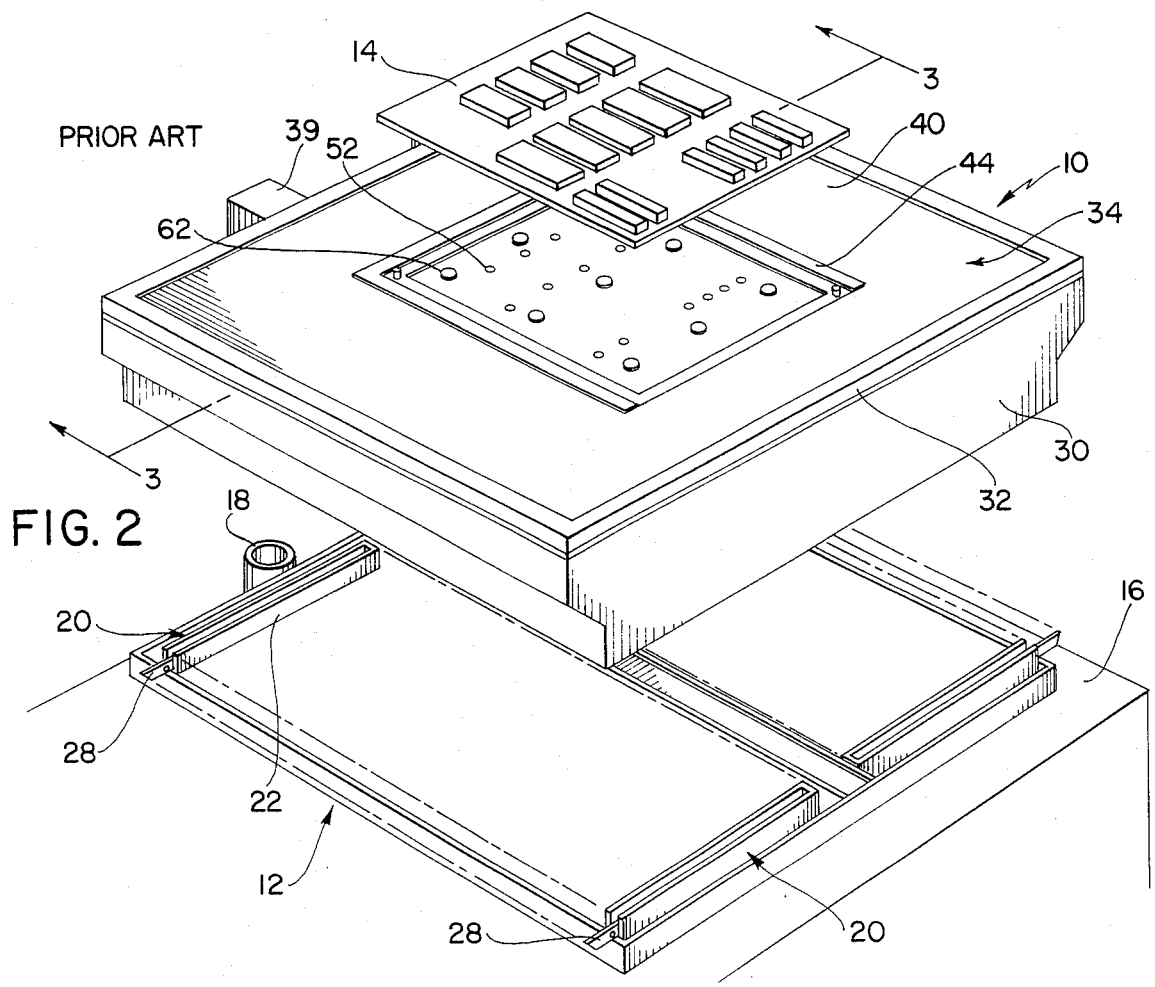
FIG. 2 is an exploded perspective view thereof.
Figure 3:
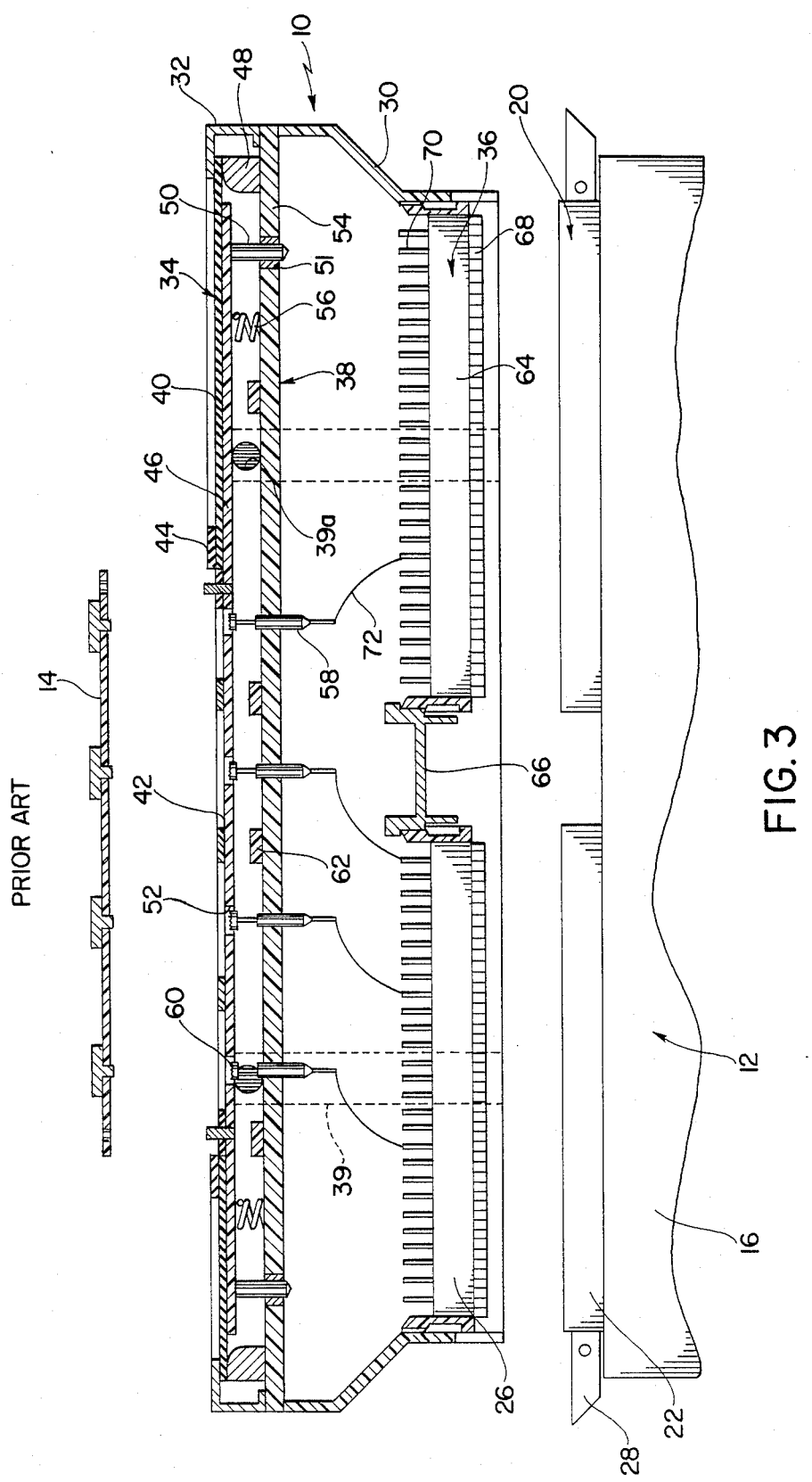
FIG. 3 is a sectional view taken along line 3—3 in FIG. 2.
Figure 4:
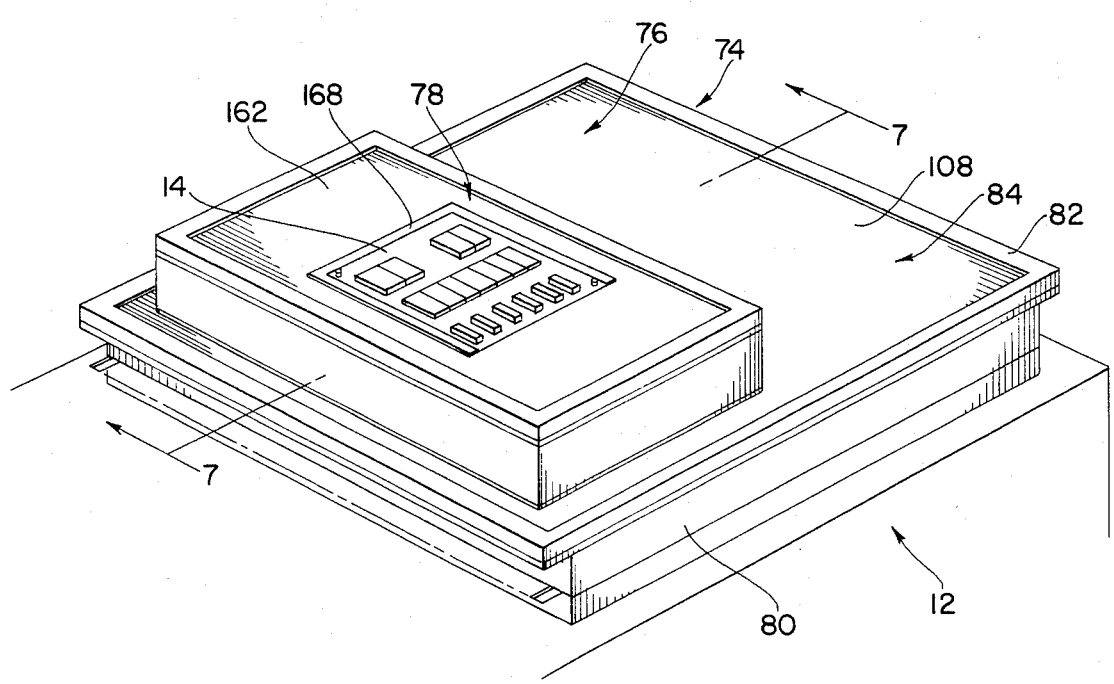
FIG. 4 is a perspective view of the test fixture of the instant invention assembled on a test system.
Figure 5:
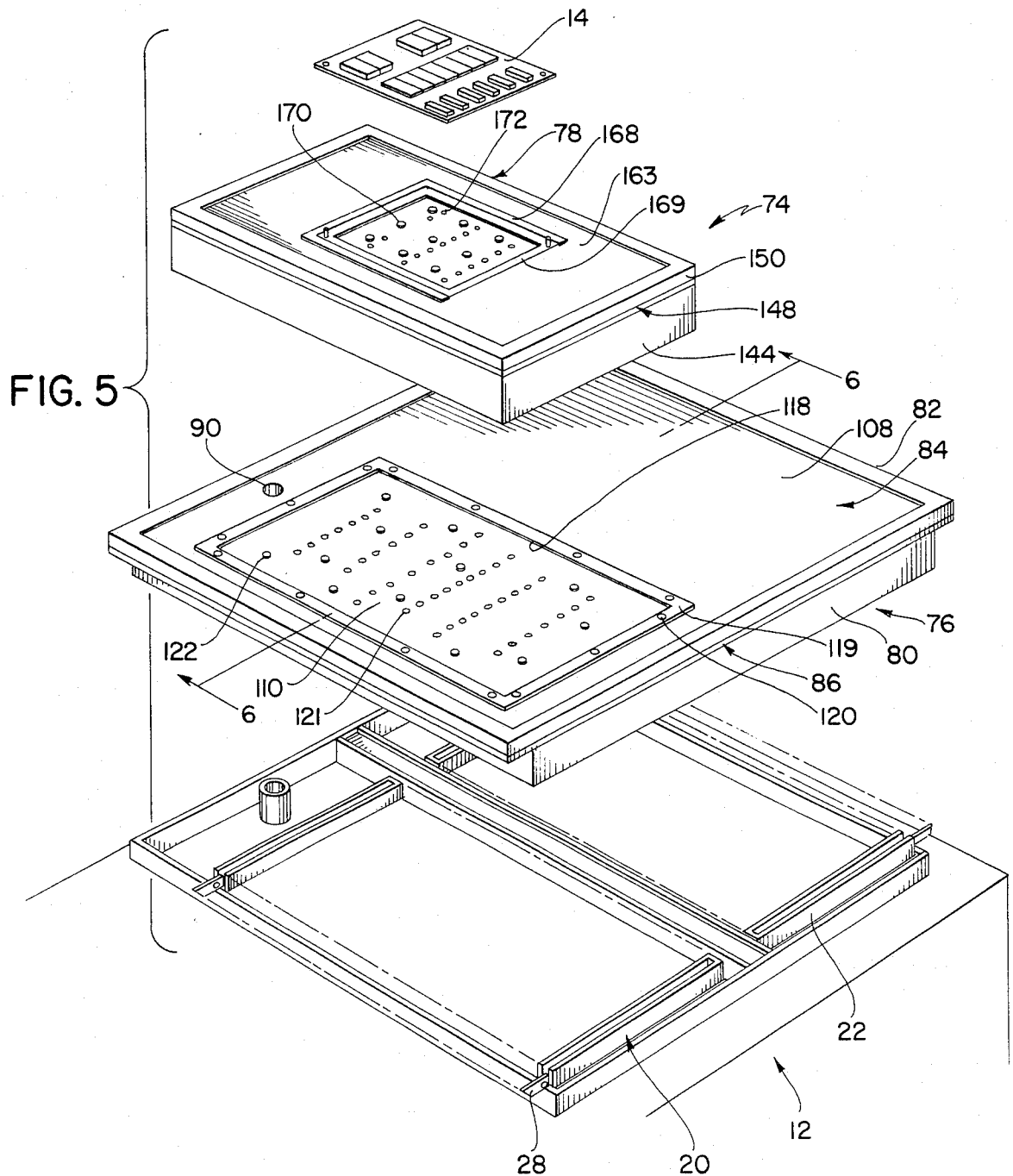
FIG. 5 is an exploded perspective view thereof.

Referring now to the drawings, a test fixture of the prior art is illustrated in FIGS. 1 through 3 and generally indicated at 10. The test fixture 10 is adapted to be assembled on a computerized test system, such as the Teradyne L200 (Teradyne Inc. TM) test system generally indicated at 12, which is operable for use in testing printed circuit boards. The test fixture 10 is further adapted for receiving a printed circuit board assembly thereon, such as the printed circuit board assembly 14, in order to electrically interconnect it to the test system 12 so that the printed circuit board assembly 14 can be electronically tested.

The test system 12 comprises a conventional computerized test system, and it includes a housing 16, a pair of vacuum ports 18 and a plurality of zero insertion force edge card connectors 20. The vacuum ports 18 open upwardly on the upper side of the housing 16 for communicating vacuum to the fixture 10 from the system 12 when the fixture 10 is received on the test system 12, and the zero insertion force edge card connectors 20 are disposed in a pair of aligned rows of adjacent side-by-side edge card connectors 20 on the upper side of the housing 16. The edge card connectors 20 are preferably of conventional construction, and they preferably each comprise a frame 22 which is adapted to receive a paddle card 26 therein of the type illustrated in FIG. 3, and a latching portion 28 for locking the paddle card 26 in the frame 22. The connectors 20 each include a plurality of aligned electrical contacts (not shown) in the frame 22 thereof which are engageable with the edge of a paddle card 26 when the paddle card 26 is assembled therewith for effecting a plurality of predetermined electrical interconnections between the paddle card 26 and the test system 12.

The test fixture 10 comprises an outer housing 30, an upper frame 32, a diaphragm assembly generally indicated at 34, a paddle card assembly generally indicated at 36, a probe plate assembly generally indicated at 38j, and a pair of vacuum tubes 39 having evacuation apertures 39a therein. The housing 30 defines the outer peripheral configuration of the fixture 10, and it provides a supporting structure for the frame 32, the diaphragm assembly 34, the paddle card assembly 36 and the probe plate assembly 38. The diaphragm assembly 34 comprises a rubberized diaphragm element 40 which includes an open receiving frame 42 having a border seal 44 therein, and a substantially rigid backup plate 46 which is secured to the underside of the diaphragm element 40. The peripheral portion of the diaphragm element 40 is captured between the outer frame 32 and a peripheral support element 48, and the support element 48 is supported on the probe plate assembly 38 which is supported on the upper edge of the housing 30. A plurality of alignment pins 50 project downwardly from the back-up plate 46 and are received in bushings 51 in the probe plate assembly 38, and a plurality of apertures 52 are provided in the back-up plate 46. The probe plate assembly 38 comprises a substantially rigid probe plate 54 having a plurality of coil springs 56 thereon which support the back-up plate 46. The probe plate assembly 38 further comprises a plurality of spring probes 58 having plunger-like contacts 60 which are aligned with the apertures 52 in the back-up plate 46 so that when the diaphragm assembly 34 is drawn downwardly, the contacts 60 pass upwardly through the apertures 52 to make electrical connections with the printed circuit board assembly 14. Also provided on the probe plate assembly 38 is a plurality of stop discs 62 which limit the downward movement of the diaphragm assembly 34. The paddle card frame 66 for securing the paddle cards 64 in the fixture 10. The paddle cards 64 are preferably of conventional construction, and they comprise individual printed circuit boards having contacts comprising gold-edge fingers 68 along the bottom edges thereof and right-angle connectors 70 along the upper edges thereof. The right-angle connectors 70 of the paddle cards 64 are electrically connected to the spring probes 58 via wires 72.

For use and operation of the fixture 10 in combination with the test system 12, the fixture 10 is assembled with the test system 12 so that the paddle cards 64 are received in the zero insertion force edge card connectors 20 with the gold-edge fingers 68 of the paddle cards 64 positioned in electrical contact with the contacts in the zero insertion force edge card connectors 20. Thereafter a printed circuit board assembly 14 is assembled in the open frame 42, and the test system 10 is operated to apply vacuum to the diaphragm assembly 34 through the vacuum tubes 18 and 39 and the apertures 39a. Accordingly, the diaphragm assembly 34 is drawn downwardly toward the probe plate assembly 38 so that the contacts 60 on the spring probes 58 engage predetermined areas of the printed circuit board assembly 14 to electrically interconnect the printed circuit board assembly 14 to the test system 10. Thereafter, the test system 10 can be operated to electrically test the printed circuit board assembly 14 in a conventional manner. However, in order to test a printed circuit board assembly of a different configuration with the test system 12, all of the latching mechanisms 28 on the edge card connectors 20 must be disengaged, and the entire fixture 10 must be removed and replaced with a similar fixture which is specifically adapted for use with the new printed circuit board assembly.

Referring now to FIGS. 4 through 7, the improved test fixture of the instant invention is illustrated and generally indicated at 74. The test fixture 74 as herein embodied is adapted to be mounted on a test system, such as the test system 12, for testing a printed circuit board 14. However, it will be understood that other embodiments of the test fixture of the subject invention which are adapted for use in combination with other types of test systems are contemplated. In any event, the important feature is that the test fixture of the subject invention is constructed as a two-piece test fixture comprising a base portion generally indicated at 76 and a test head portion generally indicated at 78 as opposed to the test fixture 10 which is constructed as a one-piece test fixture. In this connection, because the test fixture 74 is embodied as a two-piece test fixture, it is substantially more versatile and easier to use than the text fixture 10.

The base 76 is adapted to be received on the test system 12 in a manner similar to the test fixture 10, and it comprises a substantially rectangular outer housing 80 having an upper frame 82 and a diaphragm assembly 84. Also included in the base 76 is a probe plate assembly 86, a first vacuum tube 88, a second vacuum tube 90, and a paddle card assembly generally indicated at 92. The housing 80 is preferably of substantially rectangular configuration, and it is dimensioned to be received on a test system, such as the test system 12. The probe plate assembly 86 comprises a substantially planar probe plate 94 which is preferably made of a fiberglass and which is mounted on the upper edge of the housing 80. Extending through the probe plate 94 are apertures 96, and a plurality of stop discs 98 are secured on the upper side of the probe plate 94. A support element 100 is received on the peripheral portion of the probe plate 94, and the frame 82 and the support element 100 cooperate for supporting and securing the diaphragm assembly 84 on the upper end of the housing 80. More specifically, the peripheral portion of the diaphragm assembly 84 is captured between the support element 100 and the frame 82 to mount the diaphragm assembly 84 above the probe plate 94 in the base 76. The diaphragm assembly 84 cooperates with the support elements 100 and the probe plate assembly 86 to form a collapsible vacuum chamber which is collapsible upon the application of vacuum thereto to draw the test head 78 downwardly. The diaphragm assembly 84 preferably comprises a resiliently flexible rubber or neoprene diaphragm element 108 and a substantially rigid back-up plate 110 which is preferably made of fiberglass. The diaphragm element 108 overlies the back-up plate 110 and is secured thereto, and the peripheral portion of the diaphragm element 108 is received between the frame 82 and the support element 100 so that the central portion of the diaphragm element 108 and the back-up 110 can move toward and away from the probe plate 94. The back-up plate 110 is supported on a plurality of coil springs 112, and a plurality of alignment pins 114 extend downwardly from the back-up plate 110 and through bushings 116 in the probe plate 94 for guiding the diaphragm assembly 84 in its downward travel toward the probe plate 94. The diaphragm element 108 has a window 118 formed therein, and a seal 119 is received in the window 118 and secured to the back-up plate 110 so that it extends around the perimeter portion of the window 118. The seal 119 is also preferably made of rubber or neoprene, and a plurality of noncompressible stop discs 120 are mounted in apertures in the seal 119 at spaced locations around the perimeter portion of the window 118. The back-up plate 110 has a plurality of apertures 121 therein which are aligned with the apertures 96 in the probe plate 94, and a plurality of stop discs 122 are provided on the upper surface of the back-up plate 104 in the window 118. The paddle card assembly 92 comprises a plurality of conventional paddle cards 124 which are similar to the paddle cards 64 hereinabove described in connection with the fixture 10. The paddle cards 124 each include a plurality of gold-edge fingers 126 along the lower edge thereof and a plurality of connectors 128 along the upper edge thereof. The base 76 further includes a plurality of spring probes 130 which are secured in the apertures 96 in the probe plate 44 and assembled on the connectors 128 to electrically connect them to the paddle cards 92. A plurality of inner partitions 132 are provided within the housing 80 for securing the paddle cards 92 therein so that they are receivable in the zero insertion force edge card connectors 20 of the test system 12 in a manner similar to that hereinabove described in connection with the fixture 10. The first vacuum tube 88 comprises a tubular element 134 which is positioned so that the lower end thereof is receivable in a mating tubular element on the system 12, and the upper end of the tubular element 134 is secured in a fitting 136 which communicates with the open interior area between the probe plate 94 and the diaphragm assembly 84 for applying vacuum thereto. The second vacuum tube 90 comprises a tubular element 138 which is receivable in a corresponding tubular element on the test system 12, an upper fitting 140 which is received on the tubular element 98, and an upper tube 142 which is slidably received in the fitting 140 and extends through the diaphragm assembly 84 for applying vacuum to the test head 78 in a manner which will hereinafter be set forth.

Figure 6:
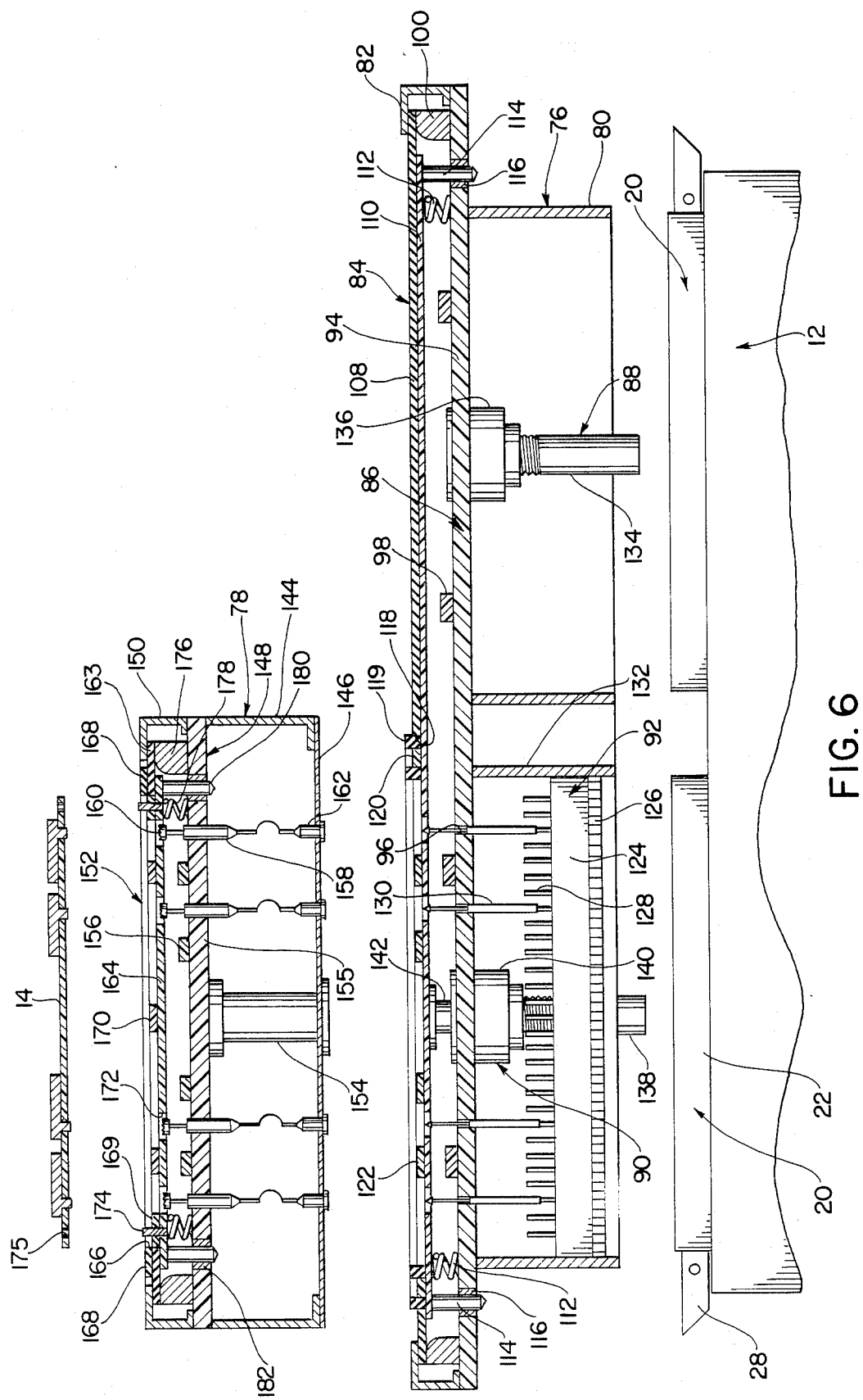
FIG. 6 is a sectional view taken along line 6—6 in FIG. 5.
Figure 7:
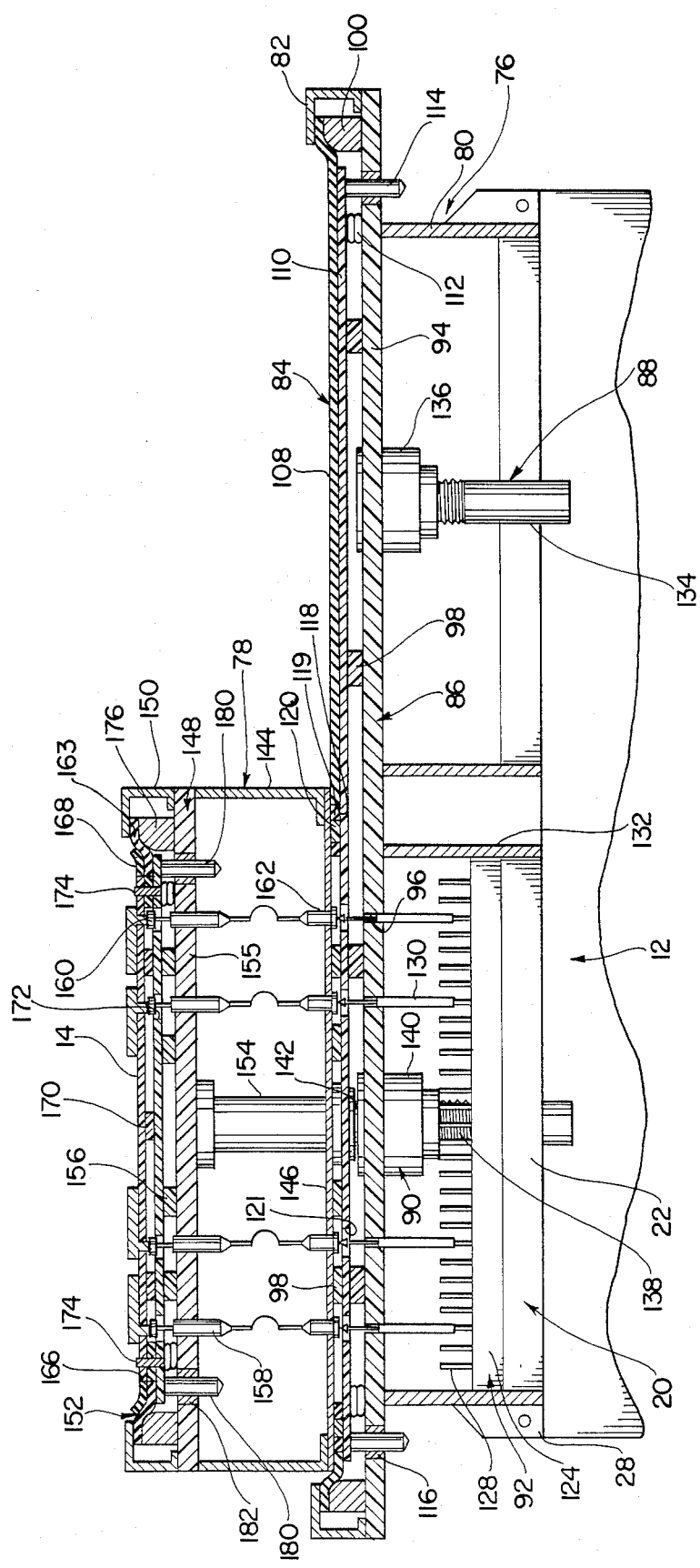
FIG. 7 is a sectional view taken along line 7—7 in FIG. 4.

The test head 78 is illustrated most clearly in FIGS. 6 and 7, and it comprises an outer housing 144, a bottom plate 146, a probe plate assembly 148, an upper frame 150, a diaphragm assembly 152, and a vacuum tube 154. The bottom plate 146 is mounted on the housing 144 at the lower end thereof, and the probe plate assembly 148 is mounted on the housing 144 adjacent the upper end thereof. The probe plate assembly 148 comprises a probe plate element 155 having a plurality of stop discs 156 thereon and a plurality of spring probes 158 which are received and secured in the probe plate element 155 and include plunger-like contact elements 160 which extend upwardly toward the diaphragm assembly 152. The spring probes 158 are electrically connected to fixed downwardly facing head contacts 162 which are assembled in the bottom plate 146, and the vacuum tube 154 extends upwardly from the bottom plate 146 through the probe plate assembly 148 so that it communicates with the space above the probe plate assembly 148. The diaphragm assembly 152 cooperates with the support elements 176 and the probe plate assembly 148 to form a collapsible vacuum chamber which is collapsible upon the application of vacuum thereto to draw the printed circuit board assembly 14 downwardly. The diaphragm assembly 152 comprises a diaphragm element 163 and a back-up plate 164, and a window 166 is formed in the diaphragm element 162. A rubber or neoprene receiving frame 168 extends around the perimeter of the window 166, and an inner seal 169 is secured to the back-up plate 164 in the peripheral portion of the window 166. A plurality of stop discs 170 are secured on the upper surface of the back-up plate 164 in the window 166, a plurality of openings 172 extend through the backup plate 164 in the window 166 and are aligned with the spring probes 158, and a plurality of alignment pins 174 extend through the seal 168 and are receivable in apertures 175 in a printed circuit board 14 for properly orienting the board 14 on the test head 78. The peripheral portion of the diaphragm element 162 is captured between the frame 150 and a support element 176 for securing the diaphragm assembly 152 in the test head 78, and a plurality of coil springs 178 support the diaphragm assembly 152 on the probe plate 148. A plurality of guide pins 180 extend downwardly from the back-up plate 164 and travel in bushings 182 in the probe plate 148 for guiding the diaphragm assembly 152 in its downward travel toward the probe plate 148.

For use and operation of the test fixture 74, the base 76 is assembled on a test system, such as the test system 12, so that the first and second vacuum tube assemblies 88 and 90 are independently connected to a vacuum source in the test system 12. The base 76 is further assembled on the test system 12 so that the paddle cards 124 thereof are received in the appropriate zero insertion force edge card connectors 20 and the latches 28 are moved to the locked positions thereof to secure the paddle cards 124 therein. The test head 78 is then assembled on the base 76 so that the vacuum tube 154 thereof communicates with the upper vacuum tube portion 142 of the second vacuum tube assembly 90 for applying vacuum to the area of the test head 78 which is between the probe plate assembly 148 thereof and the diaphragm assembly 152 thereof. A printed circuit board 14 is then assembled on the test head 78 so that it is aligned with the window 166 and so that the pins 174 extend through the alignment holes 175 in the printed circuit board 14. The test system 12 is then actuated to apply vacuum to the diaphragm assembly 84 of the base 76 and to the bottom plate 146 of the test head 78 through the apertures 121 by means of the first vacuum tube assembly 88. The system 12 is also actuated to apply vacuum to the diaphragm 152 of the test head 78 through the second vacuum tube assembly 90 and the vacuum tube 154. In this connection, the test system 12 is preferably adapted so that it can be independently actuated to apply vacuum to the diaphragm assembly 84 of the base 76 through the first vacuum tube assembly 88 and to the diaphragm assembly 152 of the test head 78 through the second vacuum tube assembly 90. In any event, as vacuum is applied to the diaphragm assembly 84 of the test head 76 through the first vacuum tube assembly 88, the diaphragm assembly 84 and the test head 78 are drawn downwardly until the back-up plate 110 engages the stop discs 98 on the probe plate 94 and the bottom plate 146 of the test head 78 is drawn into intimate engagement with the seal 119 until the seal 119 is compressed to the point where the back-up plate 146 engages the discs 120 and 122. As the diaphragm assembly 84 and the test head 78 are drawn downwardly in this manner, the spring probes 130 engage the head contacts 162 to electrically interconnect the test system 12 to the spring probes 158 of the test head 78. As the test system 12 is further actuated to apply vacuum to the diaphragm assembly 152 of the test head 78 through the second vacuum tube assembly 90 and the vacuum tube 154, the printed circuit board assembly 14 is drawn downwardly into intimate engagement with the seal 169 until the printed circuit board assembly 14 engages the stop discs 170. As the printed circuit board assembly 14 is drawn downwardly in this manner, the plunger-like contacts 160 of the spring probes 158 engage predetermined electrical components on the printed circuit board assembly 14 to electrically interconnect the printed circuit board assembly 14 to the test system 12. After the printed circuit board assembly 14 has been electrically interconnected to the test system 12 in this manner, the test system 12 can be actuated for performing a predetermined series of electrical tests on the printed circuit board assembly 14 in order to determine whether or not the printed circuit board assembly 14 is capable of operating within the desired performance specifications. In any event, after the printed circuit board assembly 14 has been tested in this manner, it is possible to quickly and easily remove it from the fixture 74 to test another printed circuit board assembly of similar construction thereon. In this regard, since the test system 12 is preferably adapted to allow vacuum to be independently applied through the first and second vacuum tube assembles 88 and 90, respectively, it is preferably possible to deactuate the vacuum which is applied to the diaphragm assembly 152 on the test head 78 without disconnecting the test head 78 from the base 76. This permits a new printed circuit board assembly 14 to be tested with the fixture 74 without electrically disconnecting the test head 78 from the base 76. When it becomes necessary to test a printed circuit board assembly of a different configuration with the test system 12, the test head 78 can be removed and replaced with a new test head which is adapted to receive the new printed circuit board thereon. This can be done quickly and easily without disconnecting the base 76 from the system 12 by merely deactuating the vacuum which is applied to the diaphragm assemblies 84 and 152 and replacing the test head 78 with a new test head of similar configuration which is adapted to be used with the new printed circuit board assembly. In this regard, since the fixture of the instant invention utilizes a test head which is adapted to be electrically interconnected to the test system 12 by merely applying vacuum to the base 76, the new test head can be quickly and easily electrically interconnected to the system 12. As a result, the test head 78 can be replaced with a new test head in a matter of seconds to enable the test system 12 to be used for testing a new printed circuit board assembly of a different configuration.

It is seen, therefore, that the instant invention provides an effective fixture for use in testing printed circuit boards on a computerized test system. Since the test head 78 is electrically connectable to the base 76 with the probes 130 and the head contacts 130, it can be quickly and easily disconnected from the base 76 to enable it to be replaced with a new test head which is adapted for testing a printed circuit board of a different configuration. Further, when the fixture 74 is used with a test system having independently actuatable vacuum assemblies for the test head and the base, it is possible to leave the test head in electrically connected relation with the base 76 while changing the printed circuit board 14. Accordingly, it is seen that the test fixture of the instant invention represents a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. In a test fixture for testing a printed circuit board assembly on a computerized test system wherein the test fixture is receivable and securable on said test system and deformable in response to the application of vacuum thereto to electrically interconnect said printed circuit board assembly to said test system and wherein said test system includes vacuum means for deforming said fixture, the improvement comprising a base which is receivable on said test system and a test head which is releasably receivable on said base and adapted to receive said printed circuit board assembly thereon, said base including a collapsible vacuum chamber which is collapsible in response to the application of vacuum thereto from said vacuum means to draw said test head toward said test system in order to electrically connect said test head to said base, said test head including a collapsible vacuum chamber which is collapsible in response to the application of vacuum thereto from said vacuum means to draw said printed circuit board assembly toward said test system in order to electrically connect said printed circuit board assembly to said test head and to thereby electrically interconnect said printed circuit board assembly to said test system when said base is electrically connected to said test system.

2. In the test fixture of claim 1, one of either said base or said test head comprising a plurality of spring probes, the other of either said test head or said base comprising a plurality of contact heads, said spring probes engaging said contact heads to electrically connect said test head to said base upon the application of vacuum to said base with said vacuum means.

3. In a test fixture for testing a printed circuit board assembly on a computerized test system wherein the test fixture is receivable and securable on said test system and deformable in response to the application of vacuum thereto to electrically interconnect said printed circuit board assembly to said test system and wherein said test system includes vacuum means for deforming said fixture, the improvement comprising a base which is receivable on said test system and a test head which is receivable on said base and adapted to receive said printed circuit board assembly thereon, said base comprising a first diaphragm having a first open receiving frame therein which is adapted to receive said test head therein, said first diaphragm communicating with said vacuum means and being deformable for electrically interconnecting said test head to said test system when said test head is received in said open receiving frame and vacuum is applied to said first diaphragm, said test head comprising a second diaphragm having a second open receiving frame therein which is adapted to receive said printed circuit board assembly therein, said second diaphragm communicating with said vacuum means and being deformable to electrically connect said printed circuit board assembly to said test head when said printed circuit board assembly is received in said second open receiving frame and vacuum is applied to said second diaphragm and to thereby also electrically interconnect said printed circuit board assembly to said test system when said test head is electrically interconnected to said test system.

4. In the test fixture of claim 3, said base further comprising a plurality of paddle cards, said test system being adapted to receive said paddle cards for electrically connecting said base to said test system.

5. In the test fixture of claim 4, said paddle cards being receivable in locked relation on said test system, said test system being adapted to receive said paddle cards in locked relation.

6. In the test fixture of claim 4, said base further comprising a plurality of spring probes, said spring probes being electrically connected to said paddle cards and being engageable with said test head for electrically interconnecting said test head to said test system upon the application of vacuum to said first diaphragm.

7. In the test fixture of claim 3, said first diaphragm comprising a resilient, flexible diaphragm element and a resiliently movable substantially rigid back-up plate, said first open receiving frame extending through said diaphragm element, said diaphragm element and said back-up plate being resiliently movable as a unit upon the application of vacuum to said first diaphragm to electrically connect said test head to said base when said test head is received on said base and vacuum is applied to said base, said base further comprising a substantially rigid probe plate, said diaphragm element and said back-up plate moving toward said probe plate upon the application of vacuum to said first diaphragm, and stop means on said probe plate for limiting the extent of the movement of said test head toward said probe plate.

8. In the test fixture of claim 7, said stop means comprising a plurality of raised discs on said probe plate.

9. In the test fixture of claim 3, said second diaphragm comprising a resilient, flexible diaphragm element and a resiliently movable, substantially rigid back-up plate, said second open receiving frame extending through said diaphragm element, said diaphragm element and said back-up plate being resiliently movable as a unit upon the application of vacuum to said second diaphragm with said vacuum means to electrically connect said printed circuit board assembly to said test head, said test head further comprising a substantially rigid probe plate, said diaphragm element and said back-up plate moving toward said probe plate upon the application of vacuum to said second diaphragm, and stop means on said probe plate for limiting the extent of the movement of said second diaphram toward said probe plate.

10. In the test fixture of claim 9, said test head further comprising a plurality of spring probes and a plurality of contact heads, said spring probes being mounted on said probe plate and being engageable with said printed circuit board assembly to electrically connect said printed circuit board assembly to said test head upon the application of vacuum to said second diaphragm, said contact heads being electrically connected to said spring probes and being engageable with said base to electrically connect said test head to said base upon the application of vacuum to said base.

11. In the test fixture of claim 3, said first open receiving frame having a compressible seal therein, said base further comprising means for limiting the compression of said seal, said test head having a bottom plate thereon which engages said seal to compress same when vacuum is applied to said base to electrically connect said test head thereto.

* * * * *